(12) United States Patent
Benckenstein, Jr. et al.

(10) Patent No.: US 8,229,689 B2
(45) Date of Patent: Jul. 24, 2012

(54) METHOD FOR DETERMINING POWER SUPPLY USAGE

(75) Inventors: Claude Leonard Benckenstein, Jr., Stafford, TX (US); Clint Alfred Davis, Houston, TX (US); Dean Perkins, Tomball, TX (US)

(73) Assignee: Southwest Electronic Energy Corporation, Stafford, TX (US)

( * ) Notice: Subject to any disclaimer, the term of this patent is extended or adjusted under 35 U.S.C. 154(b) by 0 days.

(21) Appl. No.: 13/036,435

(22) Filed: Feb. 28, 2011

(65) Prior Publication Data

US 2011/0153240 A1    Jun. 23, 2011

Related U.S. Application Data

(63) Continuation of application No. 12/190,835, filed on Aug. 13, 2008, now Pat. No. 7,917,315.

(51) Int. Cl.
*G01R 31/36* (2006.01)

(52) U.S. Cl. .................. 702/63; 320/132; 320/149

(58) Field of Classification Search ............. 702/60, 702/61, 63–65, 136; 320/132, 149; 324/426–428
See application file for complete search history.

(56) References Cited

U.S. PATENT DOCUMENTS

| 2005/0058885 A1* | 3/2005 | Brocklin et al. | 429/65 |
| 2007/0182576 A1* | 8/2007 | Proska et al. | 340/636.1 |

* cited by examiner

*Primary Examiner* — Manual L Barbee
(74) *Attorney, Agent, or Firm* — Fulbright & Jaworski, L.L.P.

(57) ABSTRACT

The remaining capacity of a battery may be monitored with a microprocessor by integrating a voltage measured across a current sense resistor coupled in series with the battery. The microprocessor may measure electrons passing through the battery by sampling the integrator and summing the values recorded from the integrator. Each time the integrator is sampled, the microprocessor may reset the integrator to prevent the integrator from saturating. The remaining capacity of the battery may be calculated based on calibration values and the sum of electrons measured by the integrator. The remaining capacity may be communicating to remote users through a network and displayed in an executive dashboard.

10 Claims, 4 Drawing Sheets

METHOD FOR DETERMINING POWER SUPPLY USAGE

CROSS REFERENCE TO RELATED APPLICATIONS

This application is a continuation of co-pending U.S. application Ser. No. 12/190,835 to Claude Leonard Benckenstein, Jr. et al., filed on Aug. 13, 2008, and entitled "Method for Determining Power Supply Usage."

TECHNICAL FIELD

The present embodiments relate to a method for measuring electron flow to determine remaining capacity of a power supply, such as a lithium primary battery, a lithium ion battery, a lead-acid battery, a fuel cell, a solar panel system, or other power supply.

BACKGROUND

A need exists for a method that accurately measures and tracks electron flow that is portably usable in many environments, easy to undertake, and inexpensive to operate.

A further need exists for a method that can be installed on a wide variety of power supplies for remote and close proximity monitoring of electron usage by a customer, a user, and an administrator simultaneously, that does not require measurement of time to determine remaining capacity.

The present embodiments meet these needs.

SUMMARY

According to one embodiment, a method for counting electrons from a power supply includes measuring a current of a power supply forming a measured current. The method also includes converting the measured current to a voltage. The method further includes integrating the voltage into a monotonic uni-polar representation of an aggregate number of electrons having an amplitude representative of the aggregate number of electrons flowing through a current sense resistor using an integrator having a capacitor. The method also includes setting a preset limit below a saturation point of the integrator. The method further includes actuating a microprocessor in communication with a data storage when the integrator reaches the preset limit of aggregate electrons. The method also includes reading the amplitude representative of the aggregate number of electrons from the integrator with the microprocessor forming a reading. The method further includes transmitting the reading to an accumulator formed in the data storage forming an accumulator value. The method also includes resetting the integrator after the transmitting the reading. The method further includes resetting the integrator after the transmitting the reading. The method also includes repeating the actuation of the microprocessor before the integrator reaches the preset limit, making additional readings and repeat the transmission to the accumulator and repeat the formation of a summation of accumulator values using the additional readings. The method further includes comparing the summation of accumulator values to a calibration value, wherein the calibration value is unique to a designated fuel gauge circuit and when the summation of accumulator values reaches the calibration value, 1 mA/hour has flowed. The method also includes recording an established standard engineering unit of capacity when the summation of accumulator values meets or exceeds the calibration value.

According to another embodiment, a method includes counting electrons flowing through a battery to create an electron count. The method also includes determining whether the electron count has reached a predetermined number. The method further includes activating a storage device to add the electron count to a total count after the determining step indicates the electron count has reached the predetermined number. The method also includes resetting the electron count after the determining step indicates the electron count has reached the predetermined number. The method further includes determining a capacity of the battery from the total count.

According to yet another embodiment, a method includes monitoring, at a processor, a capacity of a battery. The method also includes reporting, to a remote monitor, the capacity of the battery through a network. The method further includes reporting, to a user of the remote monitor, the capacity of the battery through a graphical user interface.

According to a further embodiment, an apparatus includes a processor and a memory coupled to the processor, in which the processor is configured to count electrons flowing through a battery to create an electron count. The processor is also configured to determine whether the electron count has reached a predetermined number. The processor is further configured to activate the memory to add the electron count to a total count after the determining step indicates the electron count has reached the predetermined number. The processor is also configured to reset the electron count after the determining step indicates the electron count has reached the predetermined number. The processor is further configured to determine a capacity of the battery from the total count.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
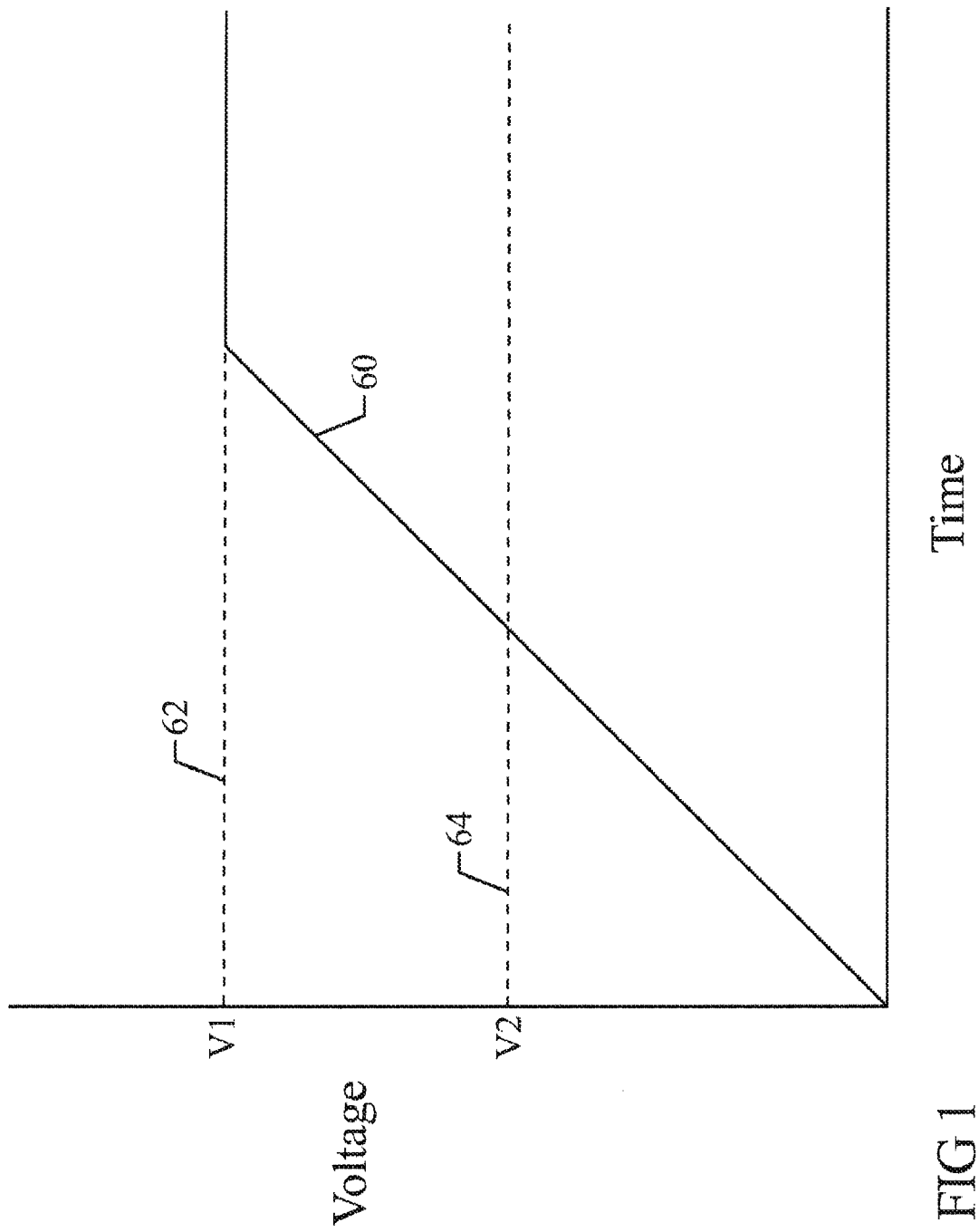
FIG. 1 is a depiction of an amplitude signal for use herein according to one embodiment of the disclosure.

Before explaining the present embodiments in detail, it is to be understood that the invention is not limited to the particular embodiments and that it can be practiced or carried out in various ways.

The present embodiments relate to a method for tracking electron flow from a power supply using a networked system. The system can utilize alarms and/or meters when electron flow is at a reduced level by accurately and with high precision tracking the electron flow.

Typically, remaining capacity of a power source is measured by recording the amount of current maintained per a unit of time. In extreme conditions, such as the high temperatures and pressures encountered within a wellbore, the accurate tracking of the passage of time, such as through use of a processor-based clock, is not possible.

The present method enables measurement of the capacity of a power source independent of elapsed time by tracking electron flow, rather than current per unit time. During operation of a power source, current is measured and converted to a voltage proportional to the current. The voltage proportional to current is converted and recorded as a monotonic uni-polar representation of an aggregate number of electrons. Subsequent representations are accumulated until this value reaches a calibration constant, at which time a known quantity of current has been maintained, such as one mA/hour, enabling capacity of the power source to be calculated in standard engineering units. The accumulated value can then be reset, allowing further accumulation until the calibration constant is again reached.

The method relates to counting electrons from a power supply.

First, a current from a power source is measured which is then termed "a measured current."

The power supply can be a lithium primary battery, a lithium-ion battery, a lead acid battery, a fuel cell, or another source of electrical energy that provides a flow of electrons in a direct current, such as electrons generated by an alternator of a car, or a generator of a boat or RV.

Next, the measured current is converted to a voltage. The conversion occurs, in an embodiment, using a current sense resistor, such as a model WSL2512RI000FEA resistor made by Vishay of the state of Pennsylvania. The current sense resistor can handle between about 0 amps and about 6 amps. This current sense resistor is placed in series with the load, the load being the device powered by the power supply. In this configuration the current at the current sense resistor is the same at the current drawn off the power supply.

The current can be a pulsed current or a constant current. In an embodiment, if the current is pulsed, is can be pulsed at about 2 amps every one second or about 1 amp every 2 seconds, or other variations of pulsed current. If the current is constant, for example, it can be about 100 mA.

The converted current is integrated into a monotonic uni-polar representation of an aggregate number of electrons through a Deboo integrator. The amplitude of the voltage is representative of the aggregate number of electrons flowing through a current sense resistor after integration using a Deboo (non-inverting) integrator with a capacitor.

The Deboo integrator is a non-inverting uni-polar integrator that forms a monotonic, nidirectional signal, wherein the amplitude represents the number of electrons flowed, similar to a trip odometer tracking mileage of a car. Other integrators can be usable herein, such as passive integrators generally known in the field of electrical engineering.

When the integrator output voltage reaches a preset limit, or a threshold, then the monotonic uni-polar representation of the aggregate number of electrons is "read" by the microprocessor forming a reading internal to the microprocessor. This reading is representative of the fact the preset limit has been reached and a corresponding number of electrons have passed through the current sense resistor.

Using an analog-to-digital converter, such as a AD7819 made by Analog Devices, the monotonic uni-polar representation of the number of aggregate electrons is identified and stored in memory of the microprocessor. Additionally, in an embodiment it is contemplated that the reading is formed using an analog to digital converter within the microprocessor.

Prior to electron saturation, the reading can be made by the microprocessor, which can be a model MC908QBMDTE, made by Freescale of Austin, Tex. The microprocessor has a processor and data storage containing computer instructions for instructing the processor to accumulate the amplitude each time the output of the integrated reaches a preset limit. Each reading is added to a memory location in the data storage where it is combined with previous readings forming a summation.

The microprocessor contains instructions for storing the value of the amplitude voltage and for adding each value to a previous sum forming a running summation. The summation, being representative of the number of times the output of the integrator has reached the preset limit, which is also proportional to the total charge which has passed from the power source.

Additionally, the microprocessor contains instructions for resetting the integrator, or discharging the integrator, once the voltage of the amplitude signal reaches a preset limit. Once this occurs, the amplitude signal will be reset, and will generally increase as a function of the signal input into the integrate as previously described.

The readings are repeated by actuating of the microprocessor before the integrator reaches the preset limit. With each reading, the accumulator value is transmitted to the accumulator, and the summation continues, causing the accumulator value to increase or remain constant, but never decrease.

The summation is then compared to a calibration value stored on the microprocessor for the particular fuel gauge. The calibration value is preloaded in the data storage. The calibration value is unique to each designated fuel gauge circuit. An example of a calibration value is 14,000. It should be noted that when the accumulator reaches the calibration constant, a known quantity of power has flowed, such as 1 mAH, enabling accurate electron tracking and determination of power source capacity.

The comparison can then be recorded as an established standard engineering unit of capacity, such as Amp Hours, when the summation of accumulator values meets or exceeds the calibration value.

In an additional embodiment, the fuel gauge can monitor and record ambient temperature, that is the temperature surrounding the power supply using a temperature sensor. After the temperature is read, then the established standard engineering unit of capacity is adjusted based on the ambient temperature.

In the fuel gauge, the current sense resistor is a sensor that determines current 15 proportional to voltage. An example of such a current sense resistor is model WSL2512RI000FEA made by Vishay of Pennsylvania.

The microprocessor used in the method enables the sensing of electron flow at temperatures ranging from about −40 degrees Centigrade to about 150 degrees Centigrade.

It should be noted that the established standard engineering unit of capacity, from the microprocessor, can be determined using a reader in a manner known to those in the field of electrical engineering.

In one embodiment, the fuel gauge can have a reader that communicates the established standard engineering unit of capacity to a user who is using at least one light emitting diode.

The communication from the reader can be over a wireless network, a hard wired network, a satellite network, or combinations thereof. The user can be connected to a website, or be connected to a graphical user interface display directly for viewing electron flow, and the fuel usage occurring to the power supply.

When the reader is in communication with a network, the fuel gauge permits continuous and automatic remote monitoring of power supply capacity.

An example of automatic, and continuous, real time monitoring is with an executive dashboard that is continually pushing the data to the user, rather than the user asking for the data. This push enables better and more accurate monitoring of the fuel use.

Monitoring using an executive dashboard enables a user to view that constant status of multiple power supplies, such as batteries, each connected via the network for constant and highly accurate measurement, such within 1 mV. Monitoring using an executive dashboard also allows for less waste of fuel, particularly in a remote environment, such as a recharging station for military radios in the middle of a barren arctic wasteland.

In an embodiment it is contemplated that the capacitor of the integrator has at least two miniature 0.01 microfarad value capacitors, each having a low loss, high temperature rating, such as 125 Centigrade, with a moderately high capacitance.

It is contemplated that a moderately high capacitance would be equivalent to about 0.22 microfarads for each capacitor.

The two capacitors can be contemplated to be connected in parallel and therefore provide a capacitance of about 0.44 microfarads. An example of such a miniature 0.01 microfarad value capacitor would be a high tech plastic fill capacitor made by Fujitsu.

A different embodiment contemplates that the capacitor can be a precision capacitor, which would have a capacity of about 0.02 microfarads.

In an embodiment the preset limit of aggregate electrons can be no more than three volts using a 12 bit converter.

Turning now to the figures, FIG. 1 illustrates a representative amplitude signal produced by the integrator for use in the invention herein. The voltage (60) produced by the integrator is a function of the voltage of the current sense resistor. The signal produced in FIG. 1 represents a generally linear increase in the voltage output by the integrator as a result of a generally constant input voltage. FIG. 1 also illustrates the saturation point VI (62) of the integrator. It can be seen once the integrator becomes saturated, the output voltage no longer increases regardless of the input voltage. FIG. 1 illustrates a preset limit (64) at V2, which is selected at a voltage below the saturation point VI (62) of the integrator. In the operation of the device a reading will be taken when the preset limit (64) is reached and the integrator will be discharged. The amplitude signal can vary based upon the input signal in a predictable way known to those in the art based on the configuration of the integrator.

Figure 2A:
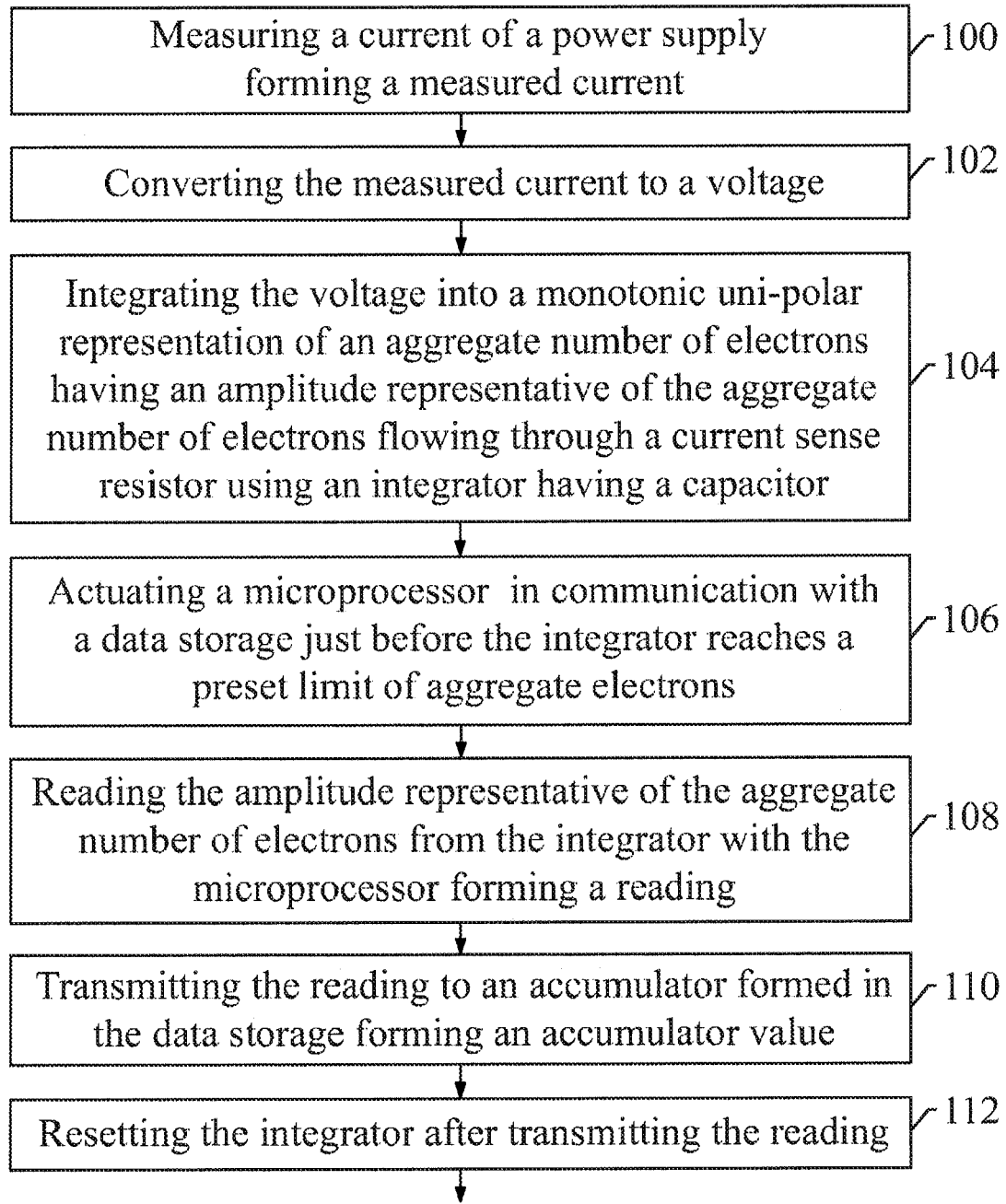
FIG. 2 is a flow chart of the method according to one embodiment of the disclosure.
Figure 2B:
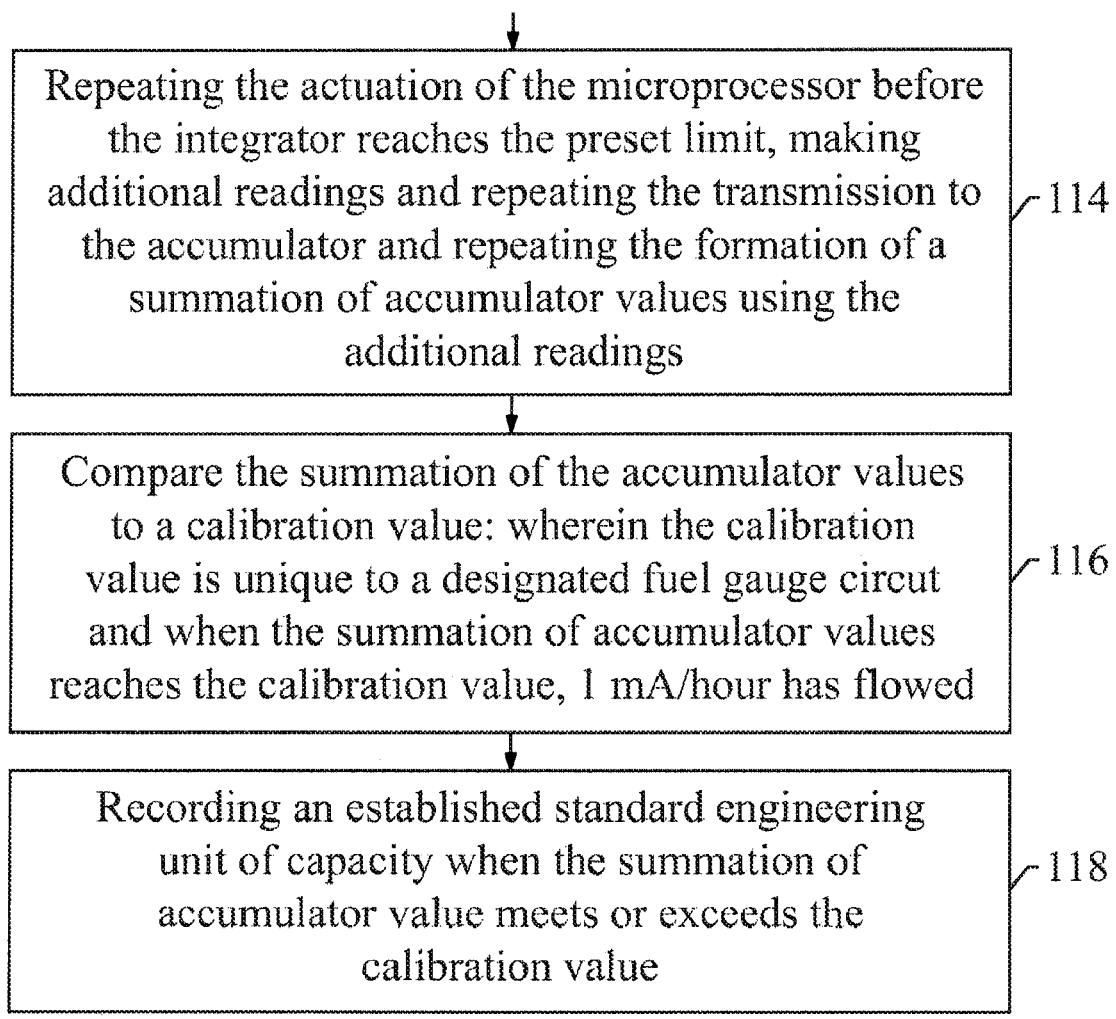

FIG. 2 shows a method for counting electrons from a power supply, the method comprising the following steps: measuring a current of a power supply forming a measured current (100); converting the measured current to a voltage (102); integrating the voltage into a monotonic uni-polar representation of an aggregate number of electrons having an amplitude representative of the aggregate number of electrons flowing through a current sense resistor using an integrator having a capacitor (104); actuating a microprocessor in communication with a data storage just before the integrator reaches a preset limit of aggregate electrons (106); reading the amplitude representative of the aggregate number of electrons from the integrator with the microprocessor forming a reading (108); transmitting the reading to an accumulator formed in the data storage forming an accumulator value (110); resetting the integrator after transmitting the reading (112); repeating the actuation of the microprocessor before the integrator reaches the preset limit, making additional readings and repeating the transmission to the accumulator and repeating the formation of a summation of accumulator values using the additional readings (114); compare the summation of accumulator values to a calibration value; wherein the calibration value is unique to a designated fuel gauge circuit and when the summation of accumulator values reaches the calibration value, 1 mA/hour has flowed (116) and recording an established standard engineering unit of capacity when the summation of accumulator values meets or exceeds the calibration value (118). A second accumulator can be used to record quantities of battery usage.

Figure 3:
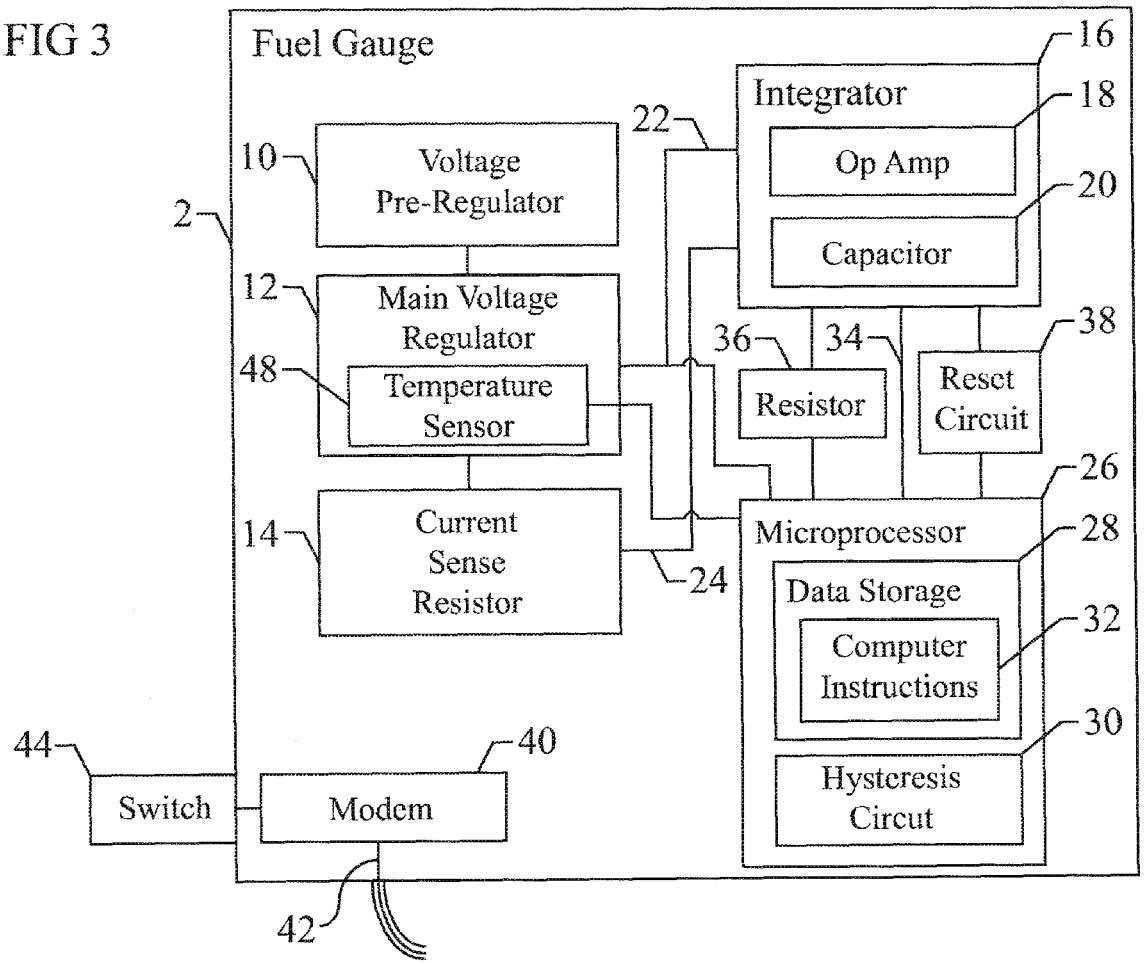
FIG. 3 is a diagram of a fuel gauge usable in the method according to one embodiment of the disclosure.

FIG. 3 shows the fuel gauge usable in this method. The fuel gauge has, in an embodiment, a voltage pre-regulator (10) for receiving current and providing a preset voltage. The voltage pre-regulator (10) is designed for 10-80V applications to provide 6 Volts. In an embodiment, the voltage pre-regulator can be resistant to extreme temperature, high pressure, shock and vibration.

Additionally, the fuel gauge has a main voltage regulator (12) in communication with the voltage pre-regulator for receiving the preset voltage and providing power to other components of the fuel gauge. The regulator can be a band gap device, designed for precision measurement applications, and is contemplated to be precise to within about 1 percent. In an embodiment, the main voltage regulator can have a maximum voltage tolerance of about 80V. In one embodiment the main voltage regulator can contain a temperature sensor (48).

An example of the voltage pre-regulator would be one such as LT3014BES5 made by Micropower. An example of the main voltage regulator would be one such as those produced by Analog Devices.

A current sense resistor (14), such as a model WSL2512RI000FEA resistor made by Vishay, is in communication with the main voltage regulator for converting the current to a voltage proportional to the current.

In an embodiment, the main voltage regulator can be a precision regulator, and the current sense resistor can be a precision resistor.

An integrator (16) is shown, comprising an op amp (18) such as a LTC2054HS5 made by Linear Technologies and a capacitor (20). The integrator (16) receives power (22) from the main voltage regulator, and an input voltage proportional to current (24) from the current sense resistor. In an embodiment, the integrator can have a saturation voltage ranging from about 0 volts to about 3 volts.

A microprocessor (26) with data storage (28), such as a MCQB8DTE made by Freescale, can be used in combination with a hysteresis circuit (30). Those of ordinary skill in the art can appreciate that the hysteresis circuit can be either be an external component for conditioning the amplitude signal of the integrator, or the hysteresis circuit can be contained within the microprocessor. The microprocessor is contemplated to remain in a low power state until activated. In one embodiment, the microprocessor can consume from one to three microwatts of power in the low power state.

The data storage, which can be fixed, removable, or remote data storage, can include computer instructions (32) for instructing the microprocessor to convert the voltage across the current sense resistor to a monotonic uni-polar representation of an 15 aggregate number of electrons (34).

A resistor (36) is disposed between the integrator and the microprocessor for activating the microprocessor from the low power state prior to saturation of the integrator with the voltage proportional to current.

A reset circuit (38) is disposed between the microprocessor and the integrator for resetting the monotonic uni-polar representation of an aggregate number of electrons to zero. In an embodiment, the reset circuit resets the integrator to zero in less than three microseconds for ensuring accuracy.

In an embodiment, the fuel gauge has a modem (40) for providing a communication signal (42) over power lines of the fuel gauge. A switch (44) can be used for controlling power to the modem.

In an embodiment, the op amp can be a low power and low drift device. The op amp can be one such as model LTC2054HS5 from Linear Technology which provides a low pollution due to noise. The op amp can receive power from the main voltage regulator. The op amp operates using a logic input that cycles to activate and deactivate the op amp.

The hysteresis circuit provides a discrete rapid output in response to a slowly changing input. The output of this circuit can be either logic 0 or 1, but input must change significantly for output to change.

While these embodiments have been described with emphasis on the embodiments, it should be understood that within the scope of the appended claims, the embodiments might be practiced other than as specifically described herein.

Although the present disclosure and its advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
    monitoring, at a processor, a capacity of a battery, in which the step of monitoring comprises:
        counting electrons flowing through the battery;
        determining whether the electron count has reached a predetermined number;
        activating a storage device to add the electron count to a total count after the determining step indicates the electron count has reached the predetermined number;
        resetting the electron count after the determining step indicates the electron count has reached the predetermined number; and
        determining the capacity of the battery from the total count;
    reporting, to a remote monitor, the capacity of the battery through a network; and
    reporting, to a user of the remote monitor, the capacity of the battery through a graphical user interface.

2. The method of claim 1, further comprising:
    monitoring a second capacity of a second battery; and
    reporting, to the remote monitor, the second capacity of the second battery through the network.

3. The method of claim 1, in which reporting to the remote monitor comprises pushing updates of the capacity through the network without receiving a request from the user.

4. An apparatus, comprising:
    at least one processor and a memory coupled to the at least one processor, in which the at least one processor is configured:
        to count electrons flowing through a battery to create an electron count;
        to determine whether the electron count has reached a predetermined number;
        to activate the memory to add the electron count to a total count after the determining step indicates the electron count has reached the predetermined number;
        to reset the electron count after the determining step indicates the electron count has reached the predetermined number; and
        to determine a capacity of the battery from the total count.

5. The apparatus of claim 4, further comprising an analog-to-digital converter coupled to the at least one processor, in which the at least one processor is configured to obtain the electron count from the analog-to-digital converter.

6. The apparatus of claim 5, further comprising an integrator coupled to the analog-to-digital converter, in which the at least one processor is configured to reset the integrator.

7. The apparatus of claim 6, in which the integrator is a Deboo integrator.

8. The apparatus of claim 6, further comprising a current sense resistor coupled to the integrator and coupled in series with the battery, in which the integrator is configured to sum electrons flowing through the current sense resistor.

9. The apparatus of claim 4, further comprising a temperature sensor coupled to the at least one processor, in which the at least one processor is further configured to monitor an ambient temperature of the battery with the temperature sensor.

10. The apparatus of claim 4, further comprising a light emitting diode coupled to the at least one processor, in which the at least one processor is configured to indicate the capacity of the battery with the light emitting diode.

* * * * *